United States Patent [19]

Michel et al.

[11] 4,434,473

[45] Feb. 28, 1984

[54] METHOD AND DEVICE FOR STORING LOGIC REPRESENTATIONS OF PROCESS STATES

[75] Inventors: Ugon Michel, Plaisir; Robert Herve, Versailles, both of France

[73] Assignee: Cii/Honeywell Bull (Societe Anonyme), Paris, France

[21] Appl. No.: 242,922

[22] Filed: Mar. 12, 1981

[30] Foreign Application Priority Data

Apr. 9, 1980 [FR] France ............................. 80 07913

[51] Int. Cl.³ .................................................. G06F 11/00
[52] U.S. Cl. ..................................................... 364/900
[58] Field of Search ........ 364/140, 141, 200 MS File, 364/900 MS File; 358/261

[56] References Cited

U.S. PATENT DOCUMENTS

| 3,390,380 | 6/1968 | Cooke-Yarborough | 364/900 |
| 3,717,851 | 2/1973 | Cocke | 364/200 |
| 3,883,847 | 5/1975 | Frank | 364/900 |
| 4,211,919 | 7/1980 | Ugon | 235/487 |
| 4,251,864 | 2/1981 | Kindell | 364/200 |
| 4,316,222 | 2/1982 | Subramaniam | 358/261 |

OTHER PUBLICATIONS

Chesarek; D. J., "Compressed Refresh System For Use With CRT Image Display." *IBM Technical Disclosure Bulletin*, vol. 20, No. 5 (Oct. 1977), pp. 1966–1969 L79010066.

*Primary Examiner*—Raulfe B. Zache
*Attorney, Agent, or Firm*—Kerkam, Stowell, Kondracki & Clarke

[57] ABSTRACT

Data representative of the state of a process capable of assuming different states is stored in a programmable read only memory having a plurality of unwritten storage locations by writing into memory beginning at an initial address data representative of an initial process state, and thereafter writing subsequent data into the memory beginning at a successive address following the initial address such that a portion of the previously written data forms the subsequent data and such that previously unwritten storage locations between the initial address and the successive address are written so that the contents of such storage locations are all in a first logic state, the contents of all locations following the subsequent data being in an opposite logic state. Data is read from the memory by scanning successive storage locations beginning at the initial address and comparing the contents of consecutive locations to determine the starting address of the data.

14 Claims, 7 Drawing Figures

METHOD AND DEVICE FOR STORING LOGIC REPRESENTATIONS OF PROCESS STATES

BACKGROUND OF THE INVENTION

The present invention relates to an electronic device rendering it possible to store logic a representation of a state of a process capable of successively assuming different possible states.

Protected access memories are known, whose principal object is to store secret or confidential data. In these memories, access is controlled by means of specialized access control logic interposed between the memory and the external surroundings. One embodiment of such access logic is disclosed in commonly-assigned Ugon U.S. Pat. No. 4,211,919 entitled "PORTABLE DATA CARRIER INCLUDING A MICROPROCESSOR". In the Ugon data carrier, the access logic is implemented by means of a microprocessor, access being obtained upon presentation of a correct password.

In many applications, it is necessary to store the number of mistakes, the number of illegal access actions or of the appearance of illegal occurrences. In the best known embodiments, the normal manner of recording such events comprises recording them in a permanent memory or in counting these by means of specialized counters making use of electrically erasable memories. A description of these devices is given in commonly-assigned U.S. patent application Ser. No. 137,973, filed Apr. 7, 1980, by Michel UGON, and entitled "DEVICE FOR THE PROTECTION OF ACCESS TO A PERMANENT MEMORY OF PORTABLE DATA CARRIER" now U.S. Pat. No. 4,295,041.

This method has at least three disadvantages. Firstly, it requires space in the principal memory. Secondly, the counting capacity is limited to the maximum capacity of the counter and cannot be modified even if space remains available in the memory. Finally the number of events recorded in the permanent memories can neither be reduced nor erased.

SUMMARY OF THE INVENTION

It is an object of the present invention to eliminate or minimize these shortcomings.

Briefly, and in accordance with one aspect of the invention, the different counting zones described in the two commonly-assigned Ugon disclosures identified above are omitted and replaced by a permanent or temporary memory, hereinafter referred to as the "state memory". As a result, it is possible to utilize the entire capacity of the memory, and the passage from one process state to another may be indicated by simple examination of the state memory.

More particularly, the device for storing logic representations of process states in accordance with the invention comprises means for storing, within an irreversible "state memory", sequences of binary patterns corresponding to each logic process state, the length of the patterns varying as a function of the types of states which may be assumed by a process, with the patterns corresponding to states encountered most frequently preferably being the shortest.

In accordance with a preferred embodiment of the invention, representations of the successive states which may be assumed by a process are written and read by the storage means in the state memory via a "shifting write-read window" having a fixed length and of which the starting address is located at a whole number of predetermined binary positions. This window is moreover applied to the state memory in such manner that all the binary bits preceding the window address are in the same state, and all those following the window are in the opposed state. The binary bits situated within the window itself are apt to assume any combination. In the preferred embodiment of the invention, the window is divided into different sections. The sections corresponding to states apt to be established most frequently are positioned closer to the beginning of the window so as to reduce the number of used binary configurations.

BRIEF DESCRIPTION OF THE DRAWINGS

In order that the invention may be more clearly understood, reference will now be made to the accompanying drawings, in which.

DESCRIPTION OF THE PREFERRED EMBODIMENT

Figure 1:
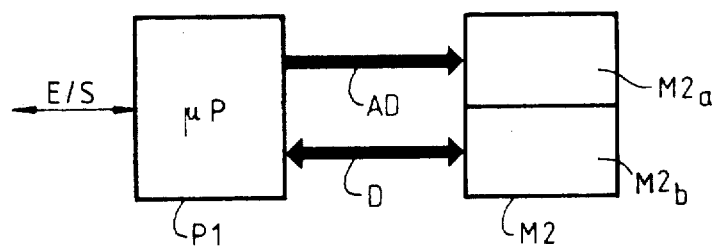
FIG. 1 is a simplified illustration of a device incorporating the invention.

Referring first to FIG. 1, an exemplary device incorporating the invention comprises control logic P1 in the form of a microprocessor which controls assess operations to the memory M2 in the read as well as write modes via its address bus AD and data bus D. For use in the practice of the invention, a suitable mircroprocessor is for example described in commonly-assigned U.S. patent application Ser. No. 207,463, filed Nov. 17, 1980 by Michel UGON, entitled "SINGLE CHIP MICROPROCESSOR WITH ON-CHIP MODIFIABLE MEMORY" (Now U.S. Pat. No. 4,382,279), which is a continuation of application Ser. No. 030,548, filed Apr. 16, 1979, and now abandoned, the entire disclosure of which is hereby expressly incorporated by reference. Access from outside the memory M2 is established by means of the specialized input/output gate E/S. The memory M2 is divided into two sections: an operating section $M2_a$, and a section $M2_b$ earmarked as a state memory.

Figure 2:
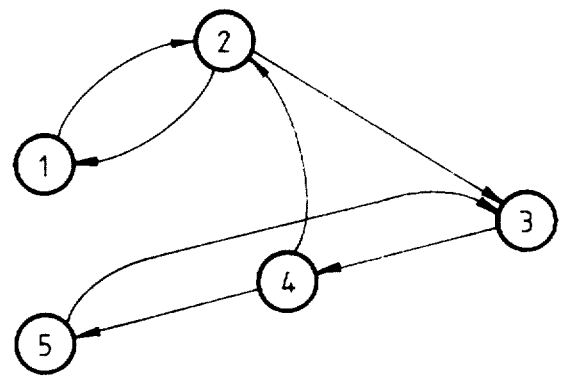
FIG. 2 illustrates a diagram of states of a process.

FIG. 2 will be employed for illustrating the operation of the device for storing logic representations of process states in a special application in which the process being monitored has five stable states designated 1 through 5. The diagram of FIG. 2 demonstrates the rules for process state changes. As may be seen, only the following transitions are authorized:

State 1 towards State 2;
State 2 towards State 1;
State 2 towards State 3;
State 3 towards State 4;
State 4 towards State 2;
State 4 towards State 5; and
State 5 towards State 3.

Among the five possible states of the process which are illustrated in FIG. 2, a particular state may be considered as having been obtained sequentially during a normal operation (States 1 and 2, for example), whereas the residual States 3, 4, and 5 are obtained by way of an exception if an abnormal (extraneous) event occurs.

Figure 3:
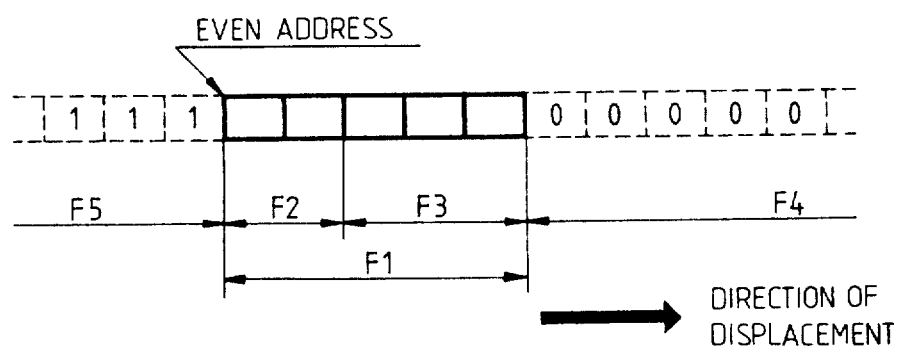
FIG. 3 is an illustration of the window for the binary reperesentation of states.

As is illustrated in FIG. 3, in accordance with an important concept of the invention, the present state of the process may be stored in the FIG. 1 state memory $M2_b$ within a section F1 of five consecutive bits. (It will be understood that the example described herein is not restricted to monitoring a process limited to five possible states, the memory section F1 having to comprise at most n consecutive bits for a process having n states.) The section F1 may be considered to be a moveable memory window through which the memory may be read and written by means of the control logic P1. As shown in FIG. 3, the window F1 is preceded by a wholly blank, i.e., unwritten, section F4 of memory, and followed by a totally writen section F5 of memory. In the example of FIG. 3, all the bits in the unwritten section F4 are in the logic state binary "0", and those of the totally written section F5 are all in the logic state binary "1". The window F1 is displaceable or shiftable with respect to one direction only in the state memory, to the right toward the unwritten section of memory as indicated in FIG. 3.

The window F1 is preferably divided into two sections as shown: a section F2 for representations of normal states (two bits), and a section F3 for representations of abnormal states (three bits). In the present case, the starting address of the window in the state memory is always even, as will be set forth in the following.

The following convention is adapted for coding representations of the the normal states:

| Window location and coding for State 1 | 1 1 \|0 0 0 0 0\| 0 0 |
|---|---|
| Window location and coding for State 2 | 1 1 \|1 0 0 0 0\| 0 0 |
| Window location and coding for return from State 1 to State 2 | 1 1 1 1 \|0 0 0 0 0\| |

In this manner, upon the return of the process to State 1 from State 2, the State 1 representation (00000) is achieved by displacing the window to the next even address (shift of two bits) and writing a bit "" in the memory location to the left of the new starting address that was previously a "0", as indicated above.

For coding the abnormal states, the following convention is adapted:

| Window location and coding for State 3 | 1 1 \|1 0 1 0 0\| 0 0 0 |
|---|---|
| Window location and coding for State 4 | 1 1 \|1 0 1 0 1\| 0 0 0 |
| Window location and coding for State 5 | 1 1 \|1 0 1 1 1\| 0 0 0 |

With these conventions, passing upon the process from State 4 (10101) to State 2 (10000), for example, the window is displaced to the right by four binary bit positions and two "1" bits are written into the two "0" locations of section F5.

In accordance with this principle, the window F1 shifts by a distance to two bits upon the process passing from one normal state to another normal state, and by four bits between a normal state and an abnormal state, or vice versa.

The starting address of the window is determined as occurring the first pair of opposite binary patterns encountered while scanning the state memory in a direction from left to right in FIG. 3, i.e., from the totally written section toward the unwritten section.

Figure 7:
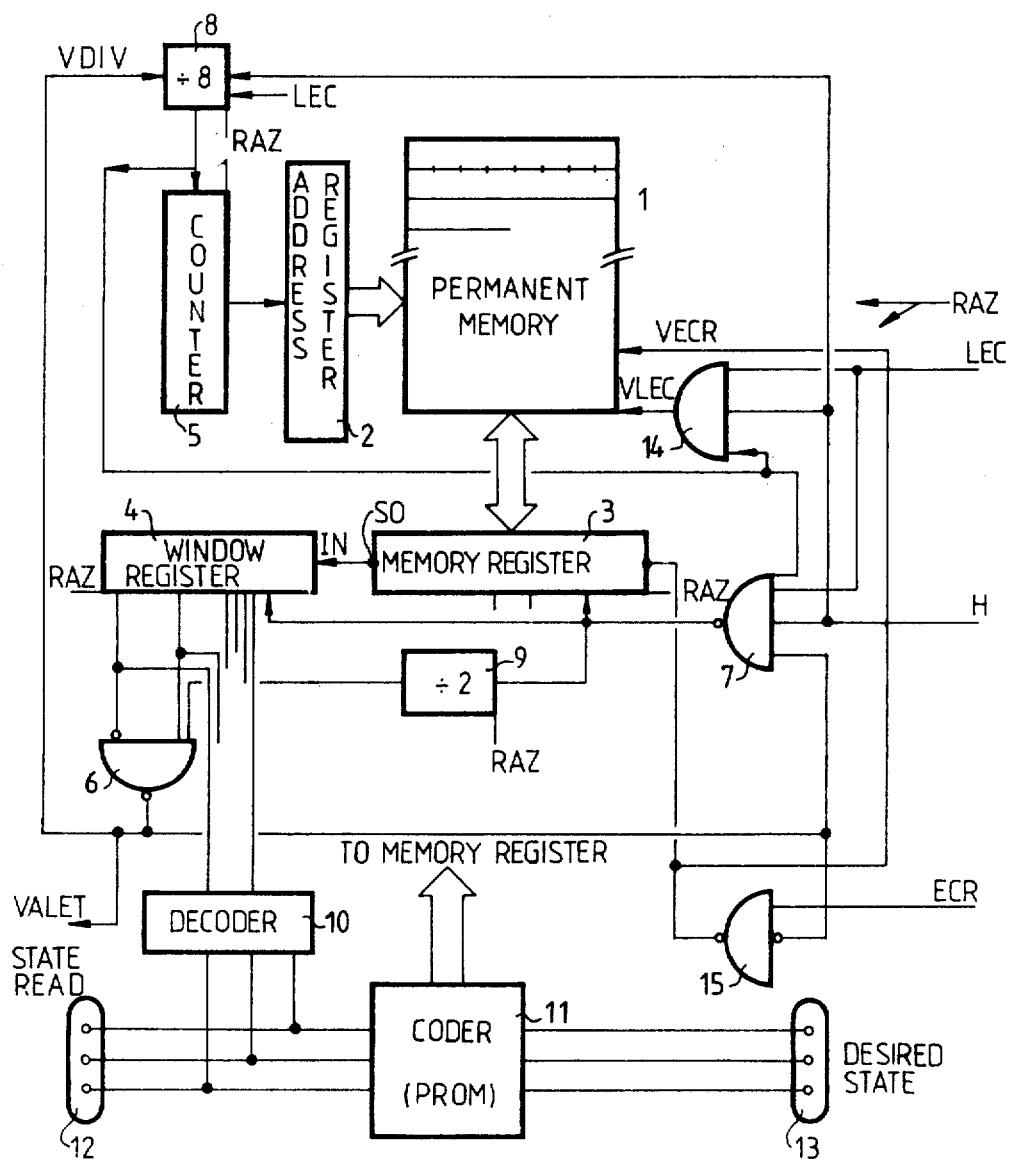
FIG. 7 shows one embodiment of a storage device in accordance with the invention.

Referring now to FIG. 7, a specific embodiment of a recording device in accordance with the principle which has been described is shown. This device comprises either an erasable or nonerasable permanent memory 1 of the FAMOS, PROM, NMOS or equivalent types. Memories of this type are described in the book "Les microprocesseurs, techniques et applications" by RODNAY ZAKS and PIERRE LE BEUX, published by SYBEX 313, rue Lecourbe 75015 PARIS. The memory 1 is addressed by an address register 2. The data to be written in or read from the memory 1 are collected in a memory register 3 comprising a bi-directional shift register 3. The serial output terminal SO of the shift register 3 is connected to the input terminal IN of a window register 4 comprising another shift register 4 intended to receive the window F1 for analysis of the process states in accordance with the invention.

The parallel outputs of this shift register 4 are applied to the input terminals of a state decoder 10, the output terminals of which are connected to a coder 11. The coder 11 may comprise a memory of the PROM or ROM type, and its function is to determine the coding within the states window F1 as a function of the state decoded by the decoder 10 following a read operation on the memory 1, and as a function of the desired state.

The state read from the memory 1 as translated by the decoder 10 appears at the output terminals 12 of the FIG. 7 device. The desired state is transmitted from the outside of the device via the input terminals 13.

The input terminals of the address register 2 are connected directly to the output terminals of a counter 5, the stepping of which is assured by the signals supplied by a pulse divider 8 having a dividing ratio of eight. The divider 8 allows the addressing of octets, i.e., eight-bit words, in the memory 1. When enabled by the signal LEC (read) applied from the outside of the device, the divider 8 counts the clock pulses H applied to its input terminal when enabled by the output of a gate 6.

The gate 6 supplies a signal VALET. The gate 6 is connected via two of its input terminals, respectively being a normal output terminal and a complemented input terminal, to the two most significant bit output terminals of window register 4, and is connected via a third input terminal to a divider having a dividing ratio of two. The input terminal of the divider 9 receives the clock pulses H supplied through a NAND gate 7, which is also connected to supply clock pulses H to the clock input terminals of the shift register 3 and 4 to provide the leftward (in the figure) shifting of the data contained in these registers. One input of the NAND gate 7 is connected to the output terminal of the divider 8, and another input terminal of the NAND gate 7 is connected to receive the read instruction (LEC) coming from outside the FIG. 7 device. Another input terminal of the NAND gate 7 is connected to the junction transmitting the clock signal H coming from outside the device. Finally, an input terminal of the NAND gate 7 is connected to the output terminal of the gate 6 generating the signal VALET.

The memory 1 is enabled in the read mode by a signal VLEC generated by an NAND gate 14 which has a first input connected to the output terminal of the divider 8, a second input terminal connected to receive clock pulses H, and a third input terminal connected to receive the read signal LEC.

The memory 1 is enabled in the write mode by a signal VECR generated by a NAND gate 15 which at a first input terminal receives the write signal ECR transmitted from outside the device, and at a second, complemented, input terminal the signal VALET transmitted by the outut terminal of the gate 6. The output terminal of the gate 15 also controls the loading of the shift register 3.

A zero reset signal RAZ is transmitted from outside the device and ensures zero reset of all the dividing and counting registers of the device.

The operation of the FIG. 7 device is as follows:

At the start, a general zero reset (RAZ) initializes the various counters, dividers and registers of the device.

Two modes of operation may occur. The first mode comprises reading the state of a process stored in the memory 1. In this case, the window register 4 being zero initially, the output terminal of the gate 6 supplies a signal at the logic "1" state which enables the NAND gate 7. As soon as the read signal LEC is applied, the memory register 3 is parallel loaded with the first octet (eight-bit word) emerging from the memory 1 during the first clock pulse H gated through the gate 14. The next seven clock pulses perform no other action than that of causing the progression of the divider 8. The next following eight pulses shift the contents of the memory register 3 into the window register 4, of which the two most significant bits are monitored permanently by the gate 6 enabled by the divide-by-two divider 9. The first of these eight pulses also increments counter 5. Two cases may then arise:

Case 1—The gate 6 does not detect any coincidence of the two bits input thereto (when the two most significant bits in the window register are the same since one input of the gate is complemented) and the first memory word (octet) read does not correspond to the state window sought. The second word is loaded into the memory register 3 in this case, and the process continues.

Case 2—A coincidence is detected by the gate 6. The gate 7 as well as the divider 8 are then blocked and stopped by the signal VALET at the output of the gate 6. The counter 5 consequently no longer progresses, fixing the address contained in the address register 2, as well as the value of the word contained in the window register 4. The decoder 10 then establishes a numeric correspondence between the binary pattern in the window register 4 and the state read from memory. This state read is disregarded by the external surroundings of the device except when the signal VALET occurs.

The second mode of operation is that of writing in the memory 1, but its realization is subordinated to the preliminary implementation of the read sequence described immediately above. It is then sufficient to apply the representation of the desired state at 13. This desired state comprises a first part of the address input of the coder 11 comprising a PROM memory, for example. The second address part comprises the state read as delivered by the decoder 10. The coder 11, as a function of the desired state and of the state read, supplies the binary pattern which is to be written in the memory to register 3. This binary pattern is transmitted in parallel into the register 3 following the write instruction ECR which should persist for the period required by the technology of the particular memory employed.

The device which has been described may be implemented by utilizing the processes for production of Large Scale Integration electronic components (LSI), in such manner that the device becomes easily transportable. An exemplary practical application of the device which has been described is the following.

There are many cases in which it is necessary to verify that a particular number of actions has been performed in a particular sequence with the possibility of a "return in reverse", that is to say that it is possible to restart one of the actions if the latter had not been performed correctly, or to eliminate marginal cases. An example may be given by following elements scheduled to undergo a variety of treatments at different locations.

Figure 4:
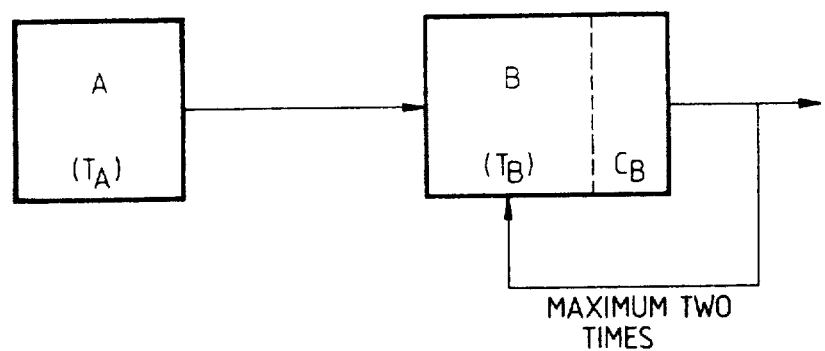
FIG. 4 is a clock diagram illustrating the course followed by an industrial process to which the invention may be applied.

With reference now to FIG. 4, the case of several specialized works taking part in the manufacture of a product P which is produced according to a sure-fire process, that is to say with the assurance of undergoing a given sequence of operations, may be considered.

In the following uncomplicated example, a single product element P undergoes a conversion $T_A$ in the factory A, for example, a machining operation on a special machine.

Product element P is then treated chemically ($T_B$) at works B which have an analytical center ($C_B$). If the analysis is negative, the product element P should undergo the treatment again, and this at most twice in succession, following which the product element P is finally scrapped.

The physical monitoring of a great number of product elements in transit between the different stations may advantageously be performed by an electronic carrier associated with each element storing the current state of the product element to which it is allocated.

Figure 5:
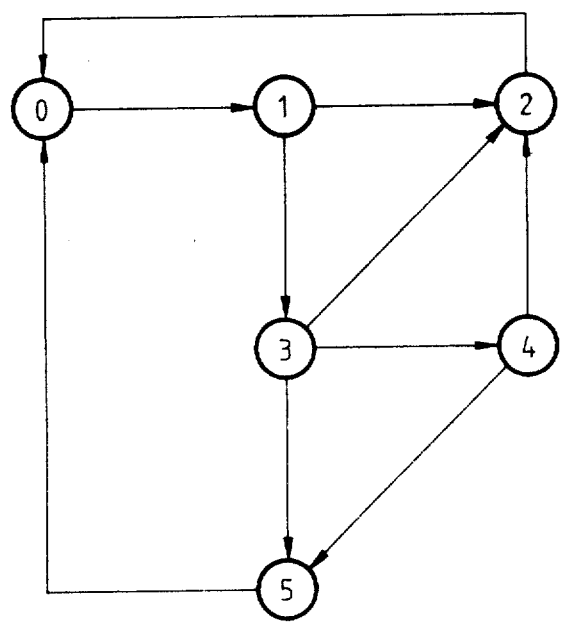
FIG. 5 illustrates a diagram of the states of the industrial process shown in FIG. 4.

It may easily be grasped from this uncomplicated example that the progress of the element may be characterized by an initial and five possible subsequent states, as represented in FIG. 5.

At each stage of the process, the electronic carrier records in its permanent memory the progress of the element, the actual recording operation being performed by a write machine coupled to the carrier.

In the case engaging our attention, the initial and five subsequent states are the following:

State 0—Initial state—Element not treated
State 1—Element treated at A
State 2—Element treated at B accepted in $C_B$
State 3—Element rejected once in $C_B$
State 4—Element rejected twice in $C_B$
State 5—Element scrapped.

These states may be recorded in the permanent memory 1 of the carrier in accordance with the method described earlier in connection with FIG. 7.

When the product element reaches the end of the treatment process, its associated carrier may be allocated to another product element (and returned to state 0), and the cycle performed again.

Figure 6:
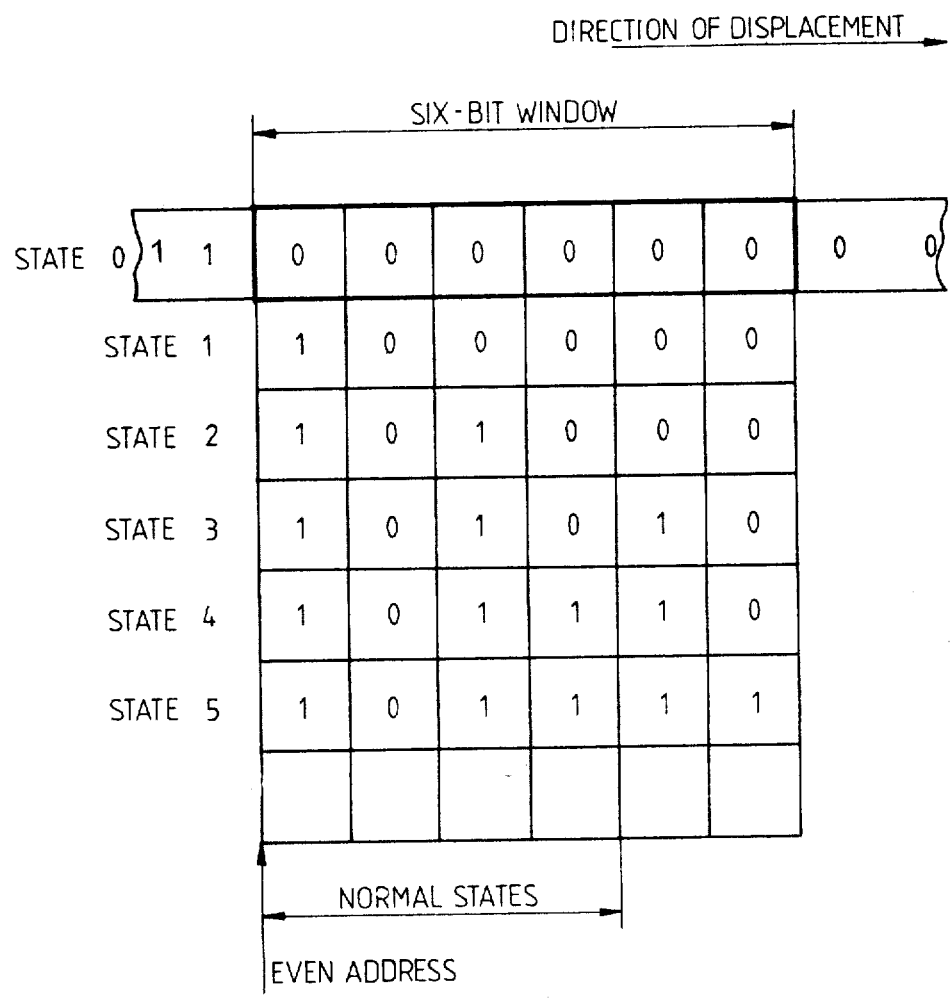
FIG. 6 illustrates a table of binary patterns utilized for the coding of the states of FIG. 5.

In FIG. 6, the binary patterns which may be utilized to represent the six states are illustrated. The window for analysis of the memory may have a width of six bits.

Consequently, it is apparent from this example, and by referring back to the diagram of the states of FIG. 5, that, when passing from one state to another, the number of bits to be written, i.e., changed, in the stored word representing the state of the element is given by the following table:

| FROM | TO | | | | | |
|---|---|---|---|---|---|---|
| | 0 | 1 | 2 | 3 | 4 | 5 |
| 0 | 0 | 1 | — | — | — | — |
| 1 | — | 0 | 1 | 2 | — | — |
| 2 | 2 | — | 0 | 1 | — | — |
| 3 | — | — | 1 | 0 | 1 | 2 |
| 4 | — | — | 2 | — | 0 | 1 |
| 5 | 1 | 1 | — | — | — | 0 |

This table demonstrates the following:

(1) Passing from one state to another is characterized by the necessity for writing at most two bits;

(2) The normal states 0, 1 and 2 utilize no more than four bits of the memory, (3) The abnormal states utilize six bits; and (4) The returns to the prior states 0 and 2 are performed by shifts of the window of two, four and six bits.

It is evident that the embodiment of the invention described is not restrictive in any way, one versed in the art being able to envisage other devices of different structures but having functions equivalent to those described in the present application. In particular, these functions may be implemented by means of microprogrammable or programmable logic systems without the concept of the invention being altered thereby.

What is claimed is:

1. A device for storing data representative of a state of a process capable of assuming different possible states, each process state being represented by a sequence of binary bits in a predetermined pattern, comprising a memory having a plurality of storage locations, each storage location having an address and the memory being initially unwritten such that the contents of storage locations following an initial address are all in a first logic state; means for addressing the memory; and means for writing data into the memory at locations selected by the addressing means, the writing means including means for writing data representative of an initial process state at consecutive storage locations beginning at the initial address and for thereafter writing subsequent data into the memory beginning at a successive address following the initial address such that a portion of previously written data comprises the subsequent data and for writing into previously unwritten storage locations between the initial address and the successive address such that the contents of storage locations between the initial address and successive address are all in a second logic state opposite to the first logic state, the contents of all locations following the subsequent data being in the first logic state.

2. A device according to claim 1, wherein the possible states of the process are of different types, and wherein the lengths of said sequences of binary bit patterns vary as a function of the type of process state, with patterns corresponding to process states encountered most frequently being the shortest.

3. A device according to claim 1 further comprising means for reading data stored in the memory, the reading means comprising means for scanning successive storage locations beginning at the initial address, and means for comparing the contents of consecutive locations to detect the starting address of the data.

4. A device according to claim 3, wherein the writing means and the reading means comprise a memory register for temporarily storing data words to be written into and which have been read from the memory, a write/-read window register having a predetermined length corresponding to a preselected number of binary bits, and means for shifting data words from the memory register into the window register, the comparing means comprising means connected to preselected positions of the window register for detecting the logic states of the bits in such positions.

5. A device according to claim 4, wherein the detecting means comprises a gate for detecting coincidence between a pair of most significant bits of a word shifted into the window register from the memory register.

6. A device according to claim 4, wherein the write/-read window is itself divided into different sections, the binary patterns corresponding to process states apt to be established most frequently being located in sections closer to the most significant bit positions of the window so as to enable binary patterns of reduced length to be employed for frequently established process states.

7. A device according to claim 6, wherein the window sections are coded in such manner that the binary positions utilized in each of the sections for frequently occurring process states are closer to the beginning of the section.

8. A device according to claim 4 further comprising means for coding the possible states of the process, the coding means having input and output terminals, the output terminals being connected to the memory register and the coding means being activated via its input terminals, on the one hand by signals representing the state of the process read in said window register, and on the other hand by signals representing the actual state of the process which is to be stored within said memory, and means for setting the actual state from the coding means into said memory register.

9. A device according to claim 1, wherein the memory is of a type that upon a storage location being written with the second logic state, the logic state of that location is thereafter unalterable by the writing means.

10. A device according to claim 9, wherein the memory is a programmable read only memory.

11. A device according to claim 1, wherein the device comprises part of a portable data carrier.

12. A method for storing in a memory data representative of a state of a process capable of assuming different states, each process state being represented by a sequence of binary bits in a predetermined pattern, the process comprising writing data representative of an initial process state into the memory at consecutive addresses beginning at an initial address, the memory having unwritten storage locations at successive addresses following the initial address, and thereafter writing subsequent data into the memory beginning at a successive address following the initial address such that a portion of the previously written data comprises a portion of the subsequent data and such that the contents of storage locations between the initial address and the successive address all have the same logic state and the contents of storage locations following the subsequent data are all of the opposite logic state.

13. A method according to claim 12 further comprising reading data from the memory by scanning successive storage locations beginning at the initial address, and comparing the logic states of consecutive storage locations to detect the starting address of the data.

14. A method according to claim 13, wherein said comparing comprises comparing the bits of consecutive pairs of bits of data words read from the memory to detect a difference in logic states between the bits of a pair.

* * * * *

UNITED STATES PATENT AND TRADEMARK OFFICE
CERTIFICATE OF CORRECTION

PATENT NO. : 4,434,473
DATED : February 28, 1984
INVENTOR(S) : Michel UGON et al It is certified that error appears in the above-identified patent and that said Letters Patent are hereby corrected as shown below:

In the line below "United States Patent [19]" change "Michel" to -- Ugon--.

Column 8, line 21 before "frequently" insert --more--.

Signed and Sealed this

Second Day of October 1984

[SEAL]

Attest:

Attesting Officer

GERALD J. MOSSINGHOFF

Commissioner of Patents and Trademarks